(12) United States Patent
Gregory et al.

(10) Patent No.: US 10,087,070 B2
(45) Date of Patent: Oct. 2, 2018

(54) MEMS SENSOR CAP WITH MULTIPLE ISOLATED ELECTRODES

(71) Applicant: Analog Devices, Inc., Norwood, MA (US)

(72) Inventors: Jeffrey A. Gregory, Malden, MA (US); See-Ho Tsang, Medford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/450,797

(22) Filed: Mar. 6, 2017

(65) Prior Publication Data

US 2017/0174504 A1   Jun. 22, 2017

Related U.S. Application Data

(62) Division of application No. 14/534,663, filed on Nov. 6, 2014, now Pat. No. 9,604,841.

(51) Int. Cl.
*B81B 7/02* (2006.01)
*B81C 1/00* (2006.01)
*B81B 7/00* (2006.01)

(52) U.S. Cl.
CPC .......... *B81B 7/007* (2013.01); *B81B 2203/04* (2013.01); *B81B 2207/097* (2013.01); *B81C 2203/0109* (2013.01); *B81C 2203/0118* (2013.01)

(58) Field of Classification Search
CPC ........ B81B 7/0032–7/0074; B81B 2203/0109; B81B 2203/0118; B81B 2203/0127;
(Continued)

(56) References Cited

U.S. PATENT DOCUMENTS 5,719,069 A  2/1998 Sparks .......................... 437/59
5,719,336 A  2/1998 Ando et al. ................. 73/514.32
(Continued)

FOREIGN PATENT DOCUMENTS

EP  0 951 068   10/1999
EP  1 808 405   7/2007
(Continued)

OTHER PUBLICATIONS

Singer, Peter, "The Future of Dielectric CVD: High-Density Plasmas?", Semiconductor International, Cahners Publishing, Jul. 1997, 6 pages.
(Continued)

*Primary Examiner* — Robert Bachner
*Assistant Examiner* — Molly Reida
(74) *Attorney, Agent, or Firm* — Wolf, Greenfield & Sacks, P.C.

(57) ABSTRACT

The cap wafer for a MEMS device includes multiple electrically isolated electrodes that can be bonded and electrically connected to separate electrical contacts on a MEMS device wafer. The electrically isolated electrodes can be used for any of a variety of functions, such as for apply a force to a movable MEMS structure on the MEMS device wafer (e.g., for driving resonance of the movable MEMS structure or for adjusting a resonance or sense mode of the movable MEMS structure) or for sensing motion of a movable MEMS structure on the MEMS device wafer. Since the electrodes are electrically isolated, different electrodes may be used for different functions.

20 Claims, 9 Drawing Sheets

(58) Field of Classification Search
CPC .......... B81B 2203/0154; B81B 7/007; B81B 2203/04; B81C 1/00095; B81C 1/00166; B81C 1/00301
See application file for complete search history.

(56) References Cited

U.S. PATENT DOCUMENTS

| | | | |
|---|---|---|---|
| 5,864,063 A | 1/1999 | Otani et al. ............... 73/514.32 |
| 5,955,380 A | 9/1999 | Lee ........................... 438/706 |
| 6,117,791 A | 9/2000 | Ko et al. .................... 438/723 |
| 6,405,592 B1 | 6/2002 | Murari et al. ............... 73/493 |
| 6,559,487 B1 * | 5/2003 | Kang .................. B81C 1/0023 257/252 |
| 6,841,992 B2 | 1/2005 | Yue et al. ................... 324/162 |
| 6,921,965 B1 | 7/2005 | Ray et al. ................... 257/659 |
| 7,140,250 B2 | 11/2006 | Leonardson et al. ...... 73/504.14 |
| 7,146,856 B2 | 12/2006 | Malametz ................. 73/514.32 |
| 7,610,809 B2 | 11/2009 | McNeil et al. ............ 73/514.32 |
| 7,736,931 B1 | 6/2010 | Guo ............................ 438/52 |
| 7,932,568 B2 | 4/2011 | Kuisma et al. ............. 257/415 |
| 8,146,425 B2 | 4/2012 | Zhang et al. ............. 73/514.32 |
| 2002/0197795 A1 | 12/2002 | Saito .......................... 438/257 |
| 2004/0248361 A1 | 12/2004 | Oh et al. ..................... 438/240 |
| 2005/0109109 A1 | 5/2005 | Eskridge et al. .......... 73/514.32 |
| 2007/0164378 A1 | 7/2007 | MacGugan ................. 257/416 |
| 2007/0190680 A1 | 8/2007 | Fukuda et al. ............... 438/50 |
| 2008/0238257 A1 | 10/2008 | Kawakubo et al. .......... 310/328 |
| 2009/0145229 A1 | 6/2009 | Gabara ..................... 73/514.32 |
| 2010/0242600 A1 | 9/2010 | Lin et al. .................. 73/504.12 |
| 2011/0014750 A1 * | 1/2011 | Peng .................. B81B 7/0064 438/121 |
| 2011/0309486 A1 * | 12/2011 | Dalal ................. B81C 1/00333 257/678 |
| 2012/0126433 A1 | 5/2012 | Montanya Silvestre ..... 257/787 |
| 2012/0313189 A1 | 12/2012 | Huang et al. ............... 257/415 |
| 2013/0105921 A1 | 5/2013 | Najafi et al. ............... 257/415 |
| 2013/0127036 A1 | 5/2013 | Kuo et al. .................. 257/704 |
| 2013/0319076 A1 | 12/2013 | Moreau ........................ 73/1.38 |
| 2013/0333471 A1 | 12/2013 | Chien ....................... 73/514.32 |
| 2014/0374850 A1 | 12/2014 | Chen et al. ................ 257/415 |
| 2016/0021824 A1 | 1/2016 | Sudbrack et al. ............. 701/50 |
| 2016/0130139 A1 | 5/2016 | Gregory et al. ............. 257/211 |

FOREIGN PATENT DOCUMENTS

| | | |
|---|---|---|
| KR | 20010028227 | 4/2001 |
| KR | 20010057139 | 7/2001 |
| KR | 20020017604 | 3/2002 |

OTHER PUBLICATIONS

Torunbalci et al., "A Novel Fabrication and Wafer Level Hermetic Sealing Method for SOI-MEMS Devices Using SOI Cap Wafers," Micro Electro Mechanical Systems (MEMS), 2015, 28th IEEE International Conference, Estoril, Portugal, Jan. 18-22, 2015, pp. 409-412.

* cited by examiner

MEMS SENSOR CAP WITH MULTIPLE ISOLATED ELECTRODES

CROSS-REFERENCE TO RELATED APPLICATION(S)

This patent application is a divisional of, and therefore claims priority from, U.S. patent application Ser. No. 14/534,663 filed Nov. 6, 2014, which is hereby incorporated herein by reference in its entirety.

TECHNICAL FIELD

The present invention relates to a MEMS sensor cap with multiple isolated electrodes, such as for tuning multiple modes of a resonator.

BACKGROUND ART

Micromachined Micro-Electro-Mechanical System (MEMS) devices are very small electro-mechanical devices that can be made to perform a variety of functions and are used in many products. For example, MEMS inertial sensors, such as accelerometers and gyroscopes, are often used for motion sensing in such things as cell phones, video game controllers, and automobile air bag and stability systems, to name but a few.

MEMS devices are fabricated from a substrate, such as a silicon or silicon-on-insulator substrate, using various types of materials and micromachining processes. Micromachining processes can include material deposition, patterning, and etching processes used to form various electrical and mechanical structures at various material layers.

Typically, a MEMS device will have various mechanical structures that need to be electrically connected to external circuitry. For example, a MEMS gyroscope typically has various drive electrodes that need to be electrically connected to a drive circuit and various sense electrodes that need to be electrically connected to a sense circuit. The external circuitry typically connects to the MEMS device through various bond pads, with each bond pad electrically connected to a corresponding mechanical structure such as a drive or sense electrode. The number of bond pads on a MEMS device can determine the minimum size of the sensor die and can limit the ability to shrink the die to reduce cost or improve functionality.

MEMS gyroscopes for sensing pitch and/or roll (typically referred to as X-axis or XY-axis gyroscopes), as well as certain MEMS accelerometers, often have out-of-plane sense modes. For various reasons, it is often necessary or desirable to match or otherwise adjust the resonance frequencies of these out-of-plane sense modes. A voltage between the moving element and the sense electrodes can be used to adjust the frequencies of these modes, but the sense electrode area is needed for sensing the rate signal.

SUMMARY OF THE EMBODIMENTS

In a first embodiment of the invention there is provided a MEMS device fabrication method comprising fabricating a plurality of electrical contacts on a top silicon layer of a cap wafer; etching exposed portions of the top silicon layer to recess such exposed portions relative to the electrical contacts; patterning the etched top silicon layer to define a plurality of electrically isolated electrodes, each electrically isolated electrode including at least one of the plurality of contacts; and etching the patterned top silicon layer to produce the plurality of electrically isolated electrodes.

In various alternative embodiments, fabricating the plurality of electrical contacts may involve depositing a layer of contact material on the top silicon layer; patterning the layer of contact material to define the plurality of electrical contacts; and etching the patterned layer of contact material to produce the plurality of electrical contacts. Depositing the layer of contact material may involve depositing a layer of aluminum or depositing a layer of germanium.

In other alternative embodiments, the method may further involve forming the top silicon layer on an underlying oxide layer, for example, by depositing polysilicon on the underlying oxide layer and optionally grinding and polishing the deposited polysilicon.

In yet other alternative embodiments, the method may further involve doping the top silicon layer to increase electrical conductivity of the top silicon layer.

In still other alternative embodiments, the top silicon layer may be on an underlying oxide layer, in which case the method may further involve etching exposed portions of the oxide layer to increase total capped volume. The oxide layer may be formed on an underlying silicon layer, in which case the method may further involve etching exposed portions of the underlying silicon layer to further increase total capped volume.

In still other alternative embodiments, the top silicon layer may be a top device layer of a silicon-on-insulator wafer, in which case the method may further involve grinding and polishing the top device layer to a desired thickness prior to fabricating the plurality of electrical contacts.

In any of the above embodiments, the method may further involve bonding the cap wafer to a device wafer having electrical contacts corresponding to the electrical contacts on the cap wafer.

In a second embodiment of the invention there is provided a cap wafer for a MEMS device comprising a plurality of electrically isolated electrodes, each electrically isolated electrode including at least one electrical contact and a silicon portion recessed from the at least one electrical contact.

In various alternative embodiments, the electrical contacts may be aluminum or germanium. The silicon portion may comprise doped silicon or polysilicon.

In a third embodiment of the invention there is provided a MEMS device comprising a cap wafer having a plurality of electrically isolated electrodes, each electrically isolated electrode including at least one electrical contact and a silicon electrode recessed from the at least one electrical contact; and a device wafer bonded to the cap wafer, the device wafer having electrical contacts corresponding to the electrical contacts on the cap wafer

BRIEF DESCRIPTION OF THE DRAWINGS

The foregoing features of embodiments will be more readily understood by reference to the following detailed description, taken with reference to the accompanying drawings, in which.

It should be noted that the foregoing figures and the elements depicted therein are not necessarily drawn to consistent scale or to any scale. Unless the context otherwise suggests, like elements are indicated by like numerals.

DETAILED DESCRIPTION OF SPECIFIC EMBODIMENTS

In exemplary embodiments, the cap wafer for a MEMS device includes multiple electrically isolated electrodes that can be bonded and electrically connected to separate electrical contacts on the MEMS device wafer. The electrically isolated electrodes can be used for any of a variety of functions, such as for applying a force to a movable MEMS structure on the MEMS device wafer (e.g., for driving resonance of the movable MEMS structure or for adjusting a resonance or sense mode of the movable MEMS structure) or for sensing motion of a movable MEMS structure on the MEMS device wafer. Since the electrodes are electrically isolated, different electrodes may be used for different functions. For example, different electrodes may be used to adjust the pitch and roll sense modes independently, e.g., where one electrically isolated electrode would be positioned above each sense mode area with electrical contacts made to those electrodes to control the voltage applied. Additionally or alternatively, one or more electrodes may be used to apply a force while one or more other electrodes may be used to sense motion.

In one exemplary embodiment, multiple electrically isolated electrodes are formed on the cap wafer beginning with normal silicon wafer as shown schematically in cross-sectional side views in FIGS. 1-9.

Figure 1:
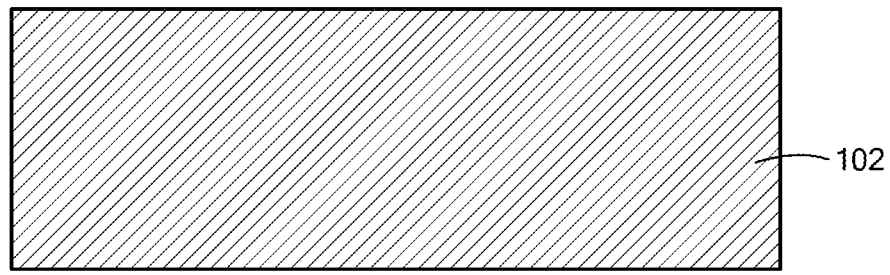
FIG. 1 shows a normal silicon substrate on which electrically isolated electrodes are formed in accordance with a first exemplary embodiment.

FIG. 1 shows a normal silicon substrate 102 on which the electrically isolated electrodes are formed.

Figure 2:
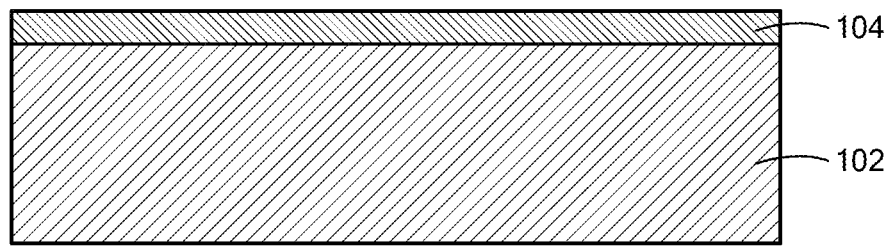
FIG. 2 shows a layer of oxide deposited onto the silicon substrate.

In FIG. 2, a layer of oxide 104 is deposited onto the substrate 102. In this example, the oxide 104 is $SiO_2$.

Figure 3:
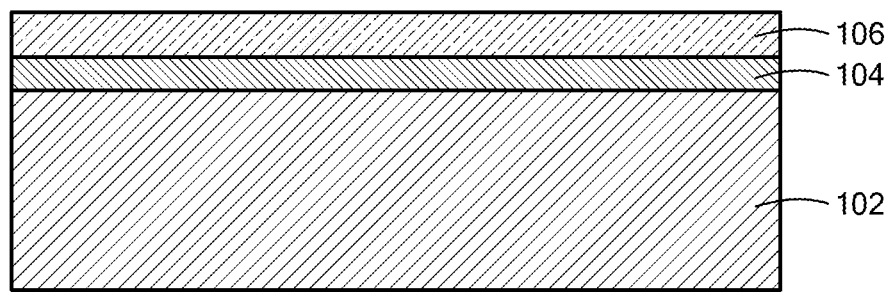
FIG. 3 shows a layer of low resistance polysilicon formed on the oxide layer.

In FIG. 3, a layer of low resistance polysilicon 106 is formed on the oxide layer 104. In this example, the polysilicon layer 106 is formed to a thickness of around 4 microns or less, which may involve depositing the polysilicon to the desired thickness or depositing the polysilicon to a greater thickness and then grinding and polishing the polysilicon to the desired thickness. The top silicon layer 106 may be doped to increase electrical conductivity.

Figure 4:
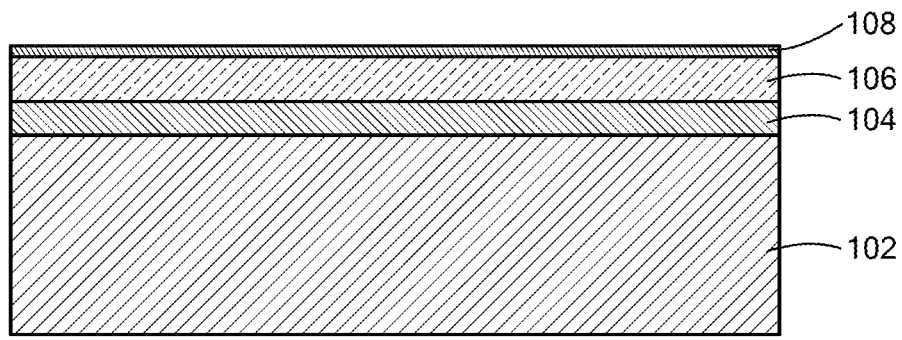
FIG. 4 shows a layer of conductor/bonding material such as aluminum or germanium formed on the polysilicon layer.

In FIG. 4, a layer of conductor/bonding material 108 such as aluminum or germanium is formed on the polysilicon layer 106.

Figure 5:
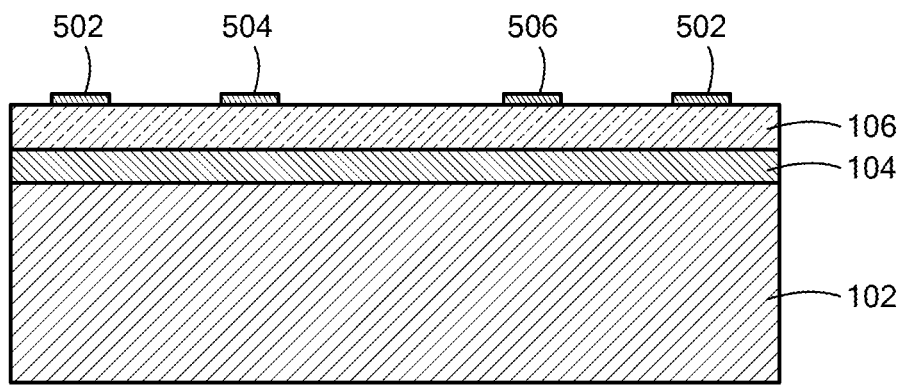
FIG. 5 shows the conductor/bonding material layer patterned to form electrical contacts for the multiple electrically isolated electrodes as well as a contact that ultimately will form an enclosure around the capped structures.

In FIG. 5, the conductor/bonding material layer 108 is patterned to form contacts 504 and 506 for the multiple electrically isolated electrodes as well as a contact 502 that ultimately will form an enclosure around the capped structures (i.e., two portions of the unitary contact 502 are shown due to the cross-sectional nature of FIG. 5). It should be noted that alternative embodiments may have any number of contacts as necessary or desirable for the specific implementation.

Figure 6:
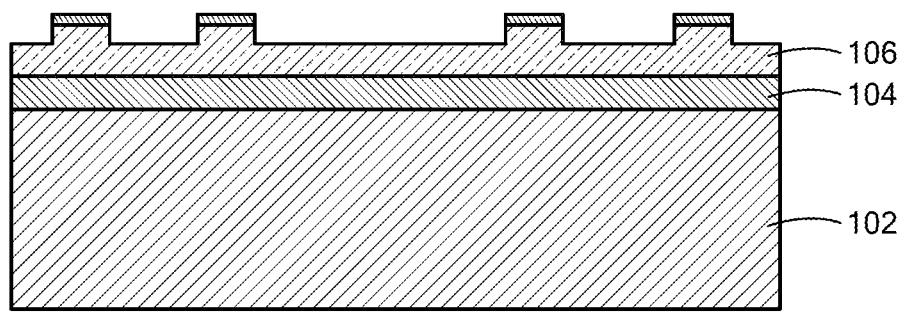
FIG. 6 shows the exposed areas of the polysilicon layer etched back to the depth desired for the gap to the device area.

In FIG. 6, the exposed areas of the polysilicon layer 106 are etched back to the depth desired for the gap to the device area such that the polysilicon layer is recessed down from the tops of the contacts. Typically, this etching involves deposition and patterning of a protective material (not shown), etching the polysilicon layer 106, and then removing the protective material. The protective material may be an oxide, nitride, or photoresist, for example.

Figure 7:
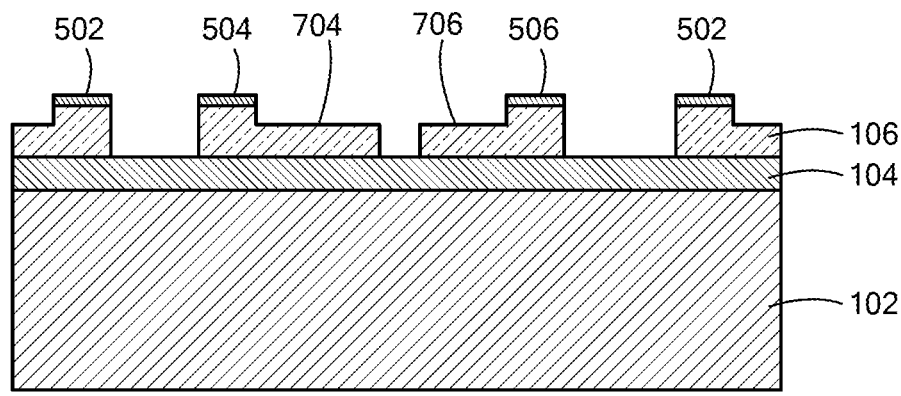
FIG. 7 shows the polysilicon layer further etched to form electrically isolated electrodes.

In FIG. 7, the polysilicon layer 106 is again etched to form electrically isolated electrodes 704 and 706. Typically, this etching involves deposition and patterning of a protective material (not shown), etching the polysilicon layer 106, and then removing the protective material. The protective material may be an oxide, nitride, or photoresist, for example. Each electrically isolated electrode includes at least one contact for making an electrical connection to the electrically isolated electrode from the device wafer when the cap wafer is bonded to the device wafer as discussed below, where the recessed silicon portion of the electrically isolated electrode is configured to interact electrostatically with a movable MEMS structure on the device wafer such as for adjusting the resonance frequency of the movable MEMS structure in an out-of-plane direction. Specifically, electrically isolated electrode 704 includes contact 504 and electrically isolated electrode 706 includes contact 506. It should be noted that alternative embodiments may have any number of electrically isolated electrodes as necessary or desirable for the specific implementation.

In this exemplary embodiment, cavity areas between the electrically isolated electrodes are expanded in order to increase the total capped volume.

Figure 8:
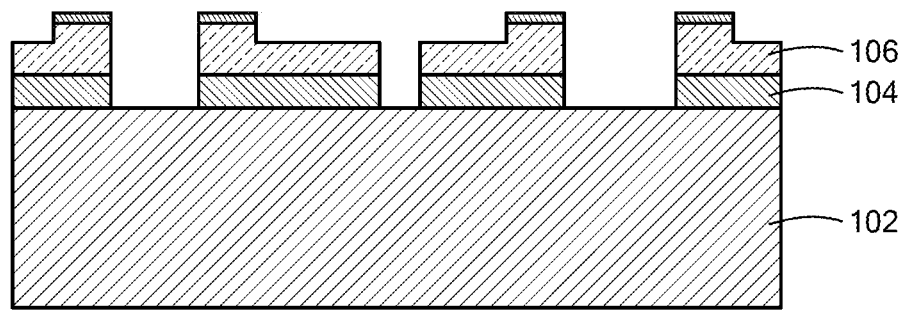
FIG. 8 shows exposed portions of the oxide layer etched away to increase the total capped volume.

In FIG. 8, exposed portions of the oxide layer 104 are etched away.

Figure 9:
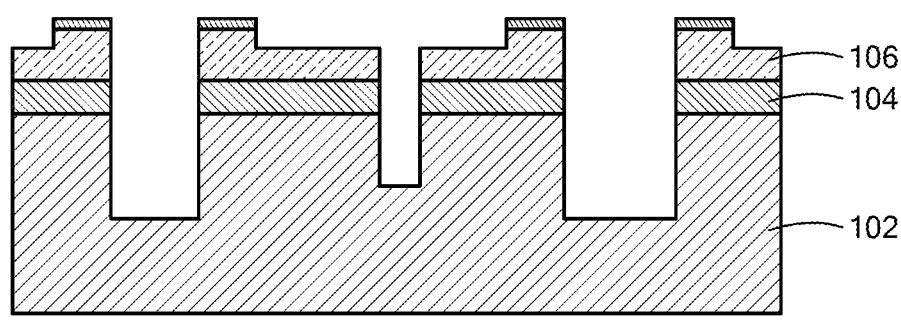
FIG. 9 shows exposed portions of the silicon substrate etched away to further increase the total capped volume and complete the cap wafer.

In FIG. 9, exposed portions of the silicon substrate 102 are etched away to complete the cap wafer 900.

Figure 10:
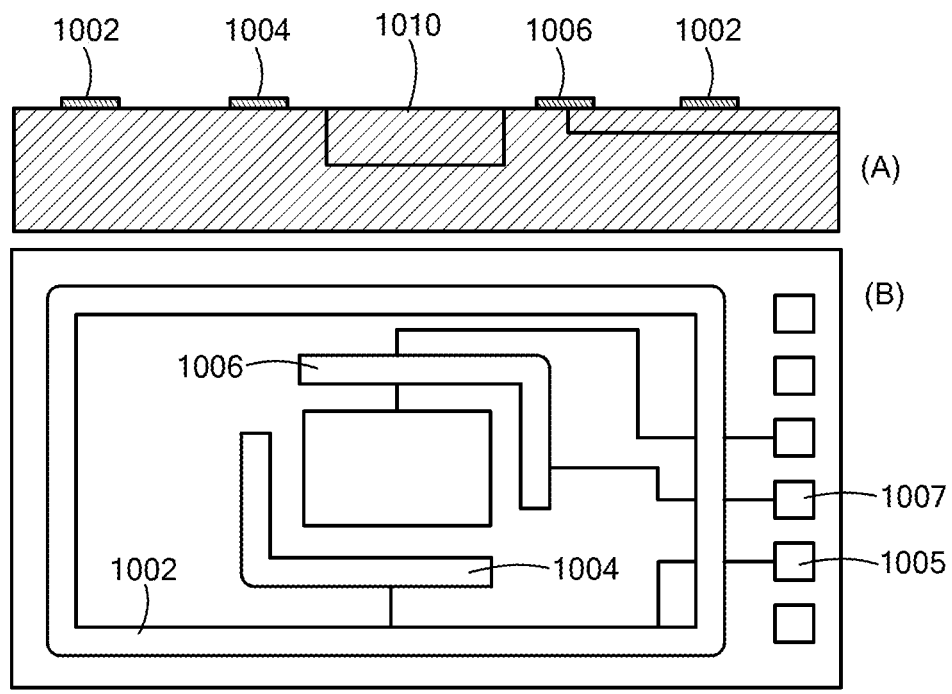
FIG. 10 is a schematic diagram showing a cross-sectional side view (A) and a top view (B) of a device wafer for use with the cap wafer, in accordance with one exemplary embodiment.

FIG. 10 is a schematic diagram showing a cross-sectional side view (A) and a top view (B) of a device wafer 1000 for use with the cap wafer 900, in accordance with one exemplary embodiment. Among other things, the device wafer includes a movable MEMS structure 1010, a contact 1002 that will be bonded to contact 502 of the cap wafer, a contact 1004 that will be bonded to contact 504 of the electrically isolated electrode 704 of the cap wafer, and a contact 1006 that will be bonded to contact 506 of the electrically isolated electrode 706 of the cap wafer. The contact 1004 is electrically connected to a bond pad 1005 for making an electrical connection to the electrically isolated electrode 704 via the contacts 1004 and 504. The contact 1006 is electrically connected to a bond pad 1007 for making an electrical connection to the electrically isolated electrode 706 via the contacts 1006 and 506. The contacts 1002, 1004 and 1006 are formed of a conductor/bonding material that is complementary to the conductor/bonding material 108. For example, when aluminum-germanium bonding is used to bond the cap wafer 900 to the device wafer 1000, the contacts on the cap wafer may be aluminum and the contacts on the device wafer may be germanium, or the contacts on the cap wafer may be germanium and the contacts on the device wafer may be aluminum.

Figure 11:
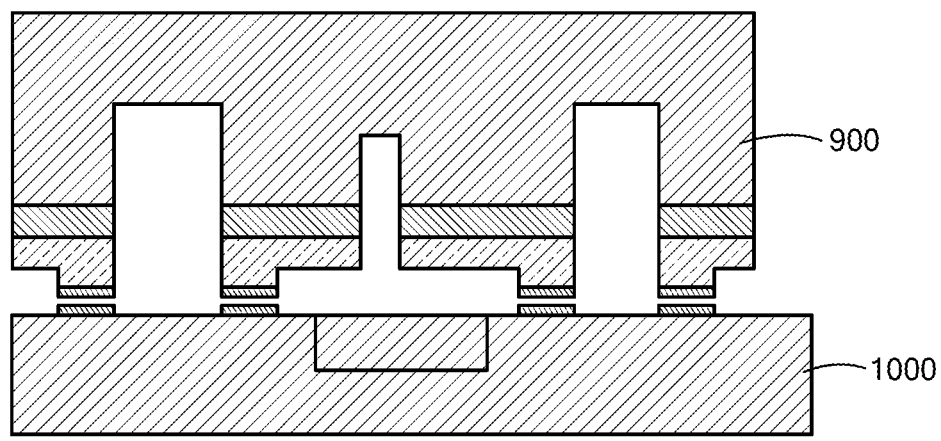
FIG. 11 shows the cap wafer bonded to the device wafer.

FIG. 11 shows the cap wafer 900 bonded to the device wafer 1000.

Figure 12:
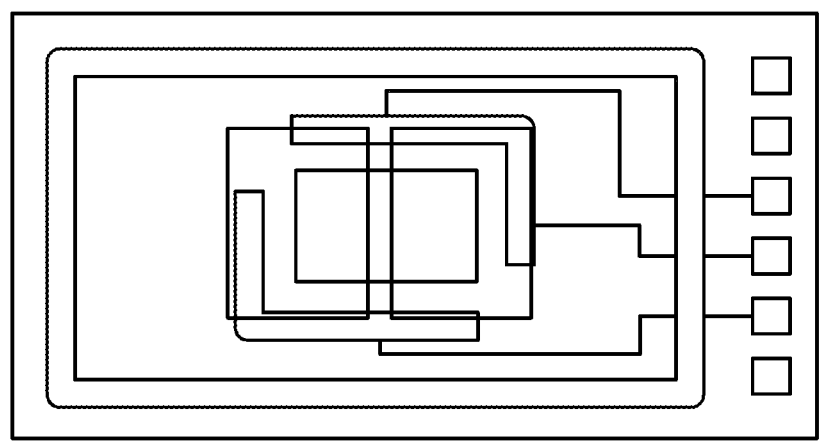
FIG. 12 shows a top "see-through" view of the device shown in FIG. 11.

FIG. 12 shows a top "see-through" view of the device shown in FIG. 11.

In another exemplary embodiment, multiple electrically isolated electrodes are formed on the cap wafer beginning with silicon-on-insulator wafer as shown schematically in cross-sectional side views in FIGS. 13-19.

Figure 13:
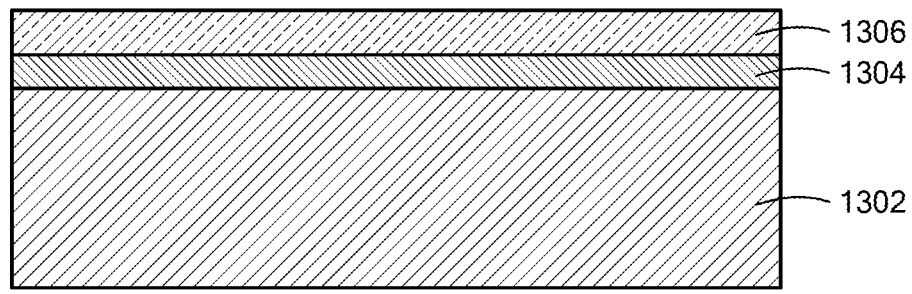
FIG. 13 shows a silicon-on-insulator wafer having a silicon base layer, an intermediate oxide layer, and a top silicon layer on which electrically isolated electrodes are formed in accordance with a second exemplary embodiment.

FIG. 13 shows a silicon-on-insulator wafer having a silicon base layer 1302, an intermediate oxide layer 1304, and a top silicon layer 1306. The top silicon layer may be ground down to a thickness of around 4 microns or less. The top silicon layer 1306 may be doped to increase electrical conductivity.

Figure 14:
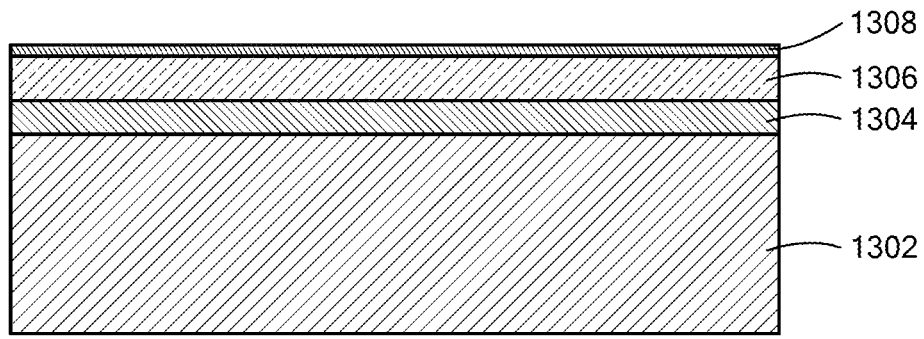
FIG. 14 shows a layer of conductor/bonding material such as aluminum or germanium formed on the top silicon layer.

In FIG. 14, a layer of conductor/bonding material 1308 such as aluminum or germanium is formed on the silicon layer 1306.

Figure 15:
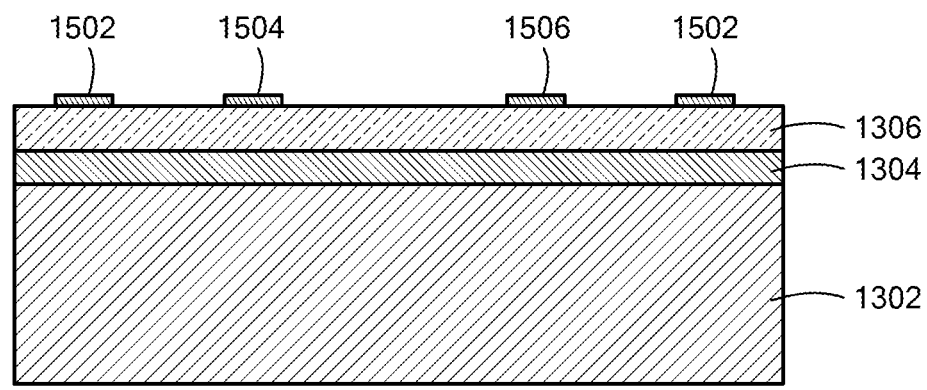
FIG. 15 shows the conductor/bonding material layer patterned to form electrical contacts for the multiple electrically isolated electrodes as well as a contact that ultimately will form an enclosure around the capped structures.

In FIG. 15, the conductor/bonding material layer 1308 is patterned to form contacts 1504 and 1506 for the multiple electrically isolated electrodes as well as a contact 1502 that ultimately will form an enclosure around the capped structures (i.e., two portions of the unitary contact 1502 are shown due to the cross-sectional nature of FIG. 15). It should be noted that alternative embodiments may have any number of contacts as necessary or desirable for the specific implementation.

Figure 16:
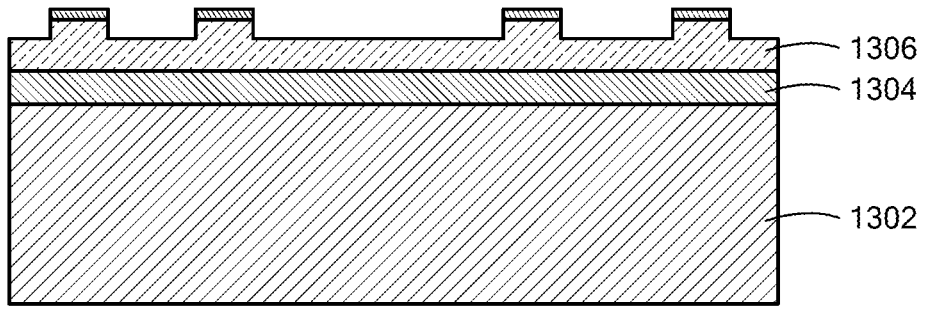
FIG. 16 shows the exposed areas of the top silicon layer etched back to the depth desired for the gap to the device area.

In FIG. 16, the exposed areas of the silicon layer 1306 are etched back to the depth desired for the gap to the device area such that the silicon layer is recessed down from the tops of the contacts. Typically, this etching involves deposition and patterning of a protective material (not shown), etching the silicon layer 1306, and then removing the protective material. The protective material may be an oxide, nitride, or photoresist, for example.

Figure 17:
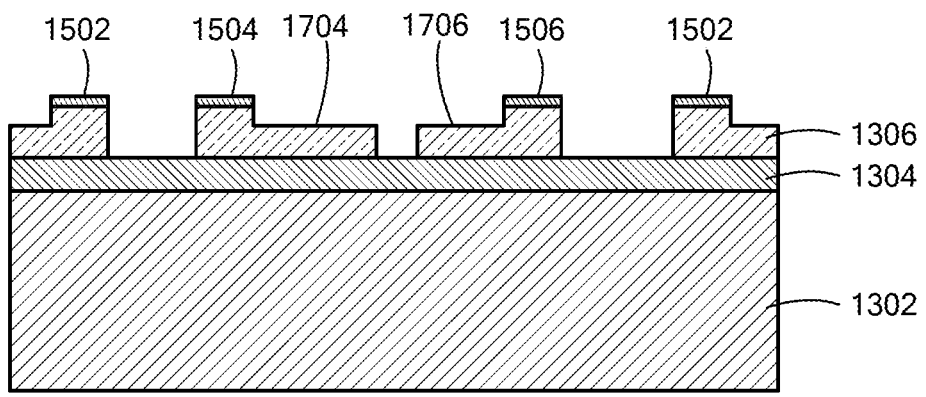
FIG. 17 shows the top silicon layer further etched to form electrically isolated electrodes.

In FIG. 17, the silicon layer 1306 is again etched to form electrically isolated electrodes 1704 and 1706. Typically, this etching involves deposition and patterning of a protective material (not shown), etching the silicon layer 1306, and then removing the protective material. The protective material may be an oxide, nitride, or photoresist, for example. Each electrically isolated electrode includes at least one contact for making an electrical connection to the electrically isolated electrode from the device wafer when the cap wafer is bonded to the device wafer as discussed below, where the recessed silicon portion of the electrically isolated electrode is configured to interact electrostatically with a movable MEMS structure on the device wafer such as for adjusting the resonance frequency of the movable MEMS structure in an out-of-plane direction. Specifically, electrically isolated electrode 1704 includes contact 1504 and electrically isolated electrode 1706 includes contact 1506. It should be noted that alternative embodiments may have any number of electrically isolated electrodes as necessary or desirable for the specific implementation.

In this exemplary embodiment, cavity areas between the electrically isolated electrodes are expanded in order to increase the total capped volume.

Figure 18:
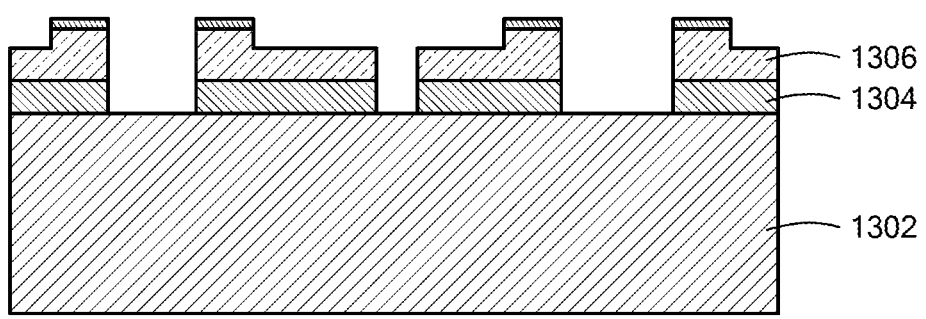
FIG. 18 shows exposed portions of the oxide layer etched away to increase the total capped volume.

In FIG. 18, exposed portions of the oxide layer 1304 are etched away.

Figure 19:
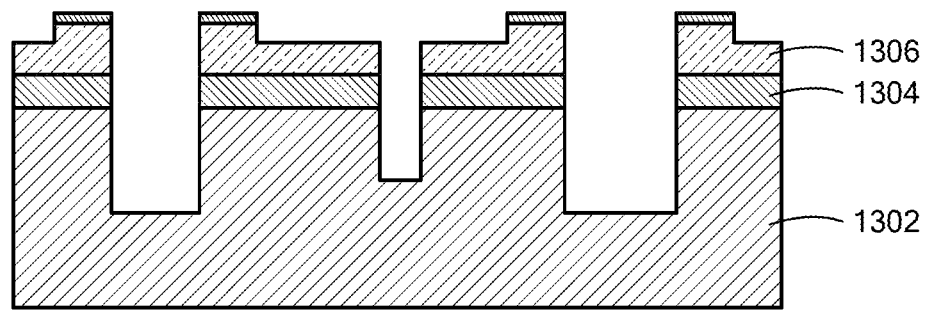
FIG. 19 shows exposed portions of the silicon substrate etched away to further increase the total capped volume and complete the cap wafer.

In FIG. 19, exposed portions of the silicon substrate 1302 are etched away to complete the cap wafer 1900.

Figure 20:
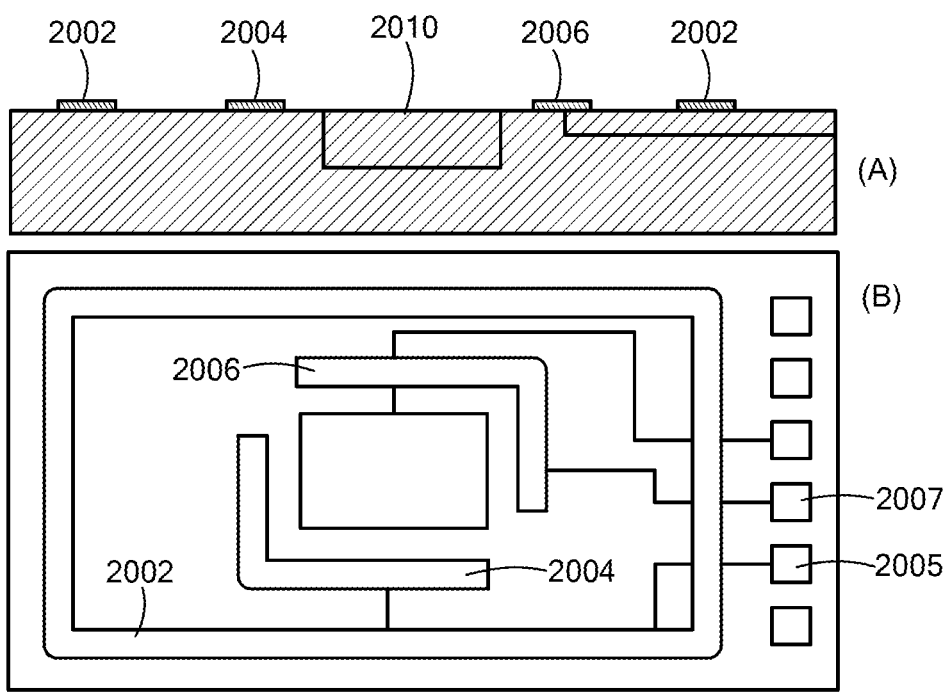
FIG. 20 is a schematic diagram showing a cross-sectional side view (A) and a top view (B) of a device wafer for use with the cap wafer, in accordance with one exemplary embodiment.

FIG. 20 is a schematic diagram showing a cross-sectional side view (A) and a top view (B) of a device wafer 2000 for use with the cap wafer 1900, in accordance with one exemplary embodiment. Among other things, the device wafer includes a movable MEMS structure 2010, a contact 2002 that will be bonded to contact 1502 of the cap wafer, a contact 2004 that will be bonded to contact 1504 of the electrically isolated electrode 1704 of the cap wafer, and a contact 2006 that will be bonded to contact 1506 of the electrically isolated electrode 1706 of the cap wafer. The contact 2004 is electrically connected to a bond pad 2005 for making an electrical connection to the electrically isolated electrode 1704 via the contacts 2004 and 1504. The contact 2006 is electrically connected to a bond pad 2007 for making an electrical connection to the electrically isolated electrode 1706 via the contacts 2006 and 1506. The contacts 2002, 2004 and 2006 are formed of a conductor/bonding material that is complementary to the conductor/bonding material 1308. For example, when aluminum-germanium bonding is used to bond the cap wafer 1900 to the device wafer 2000, the contacts on the cap wafer may be aluminum and the contacts on the device wafer may be germanium, or the contacts on the cap wafer may be germanium and the contacts on the device wafer may be aluminum.

Figure 21:
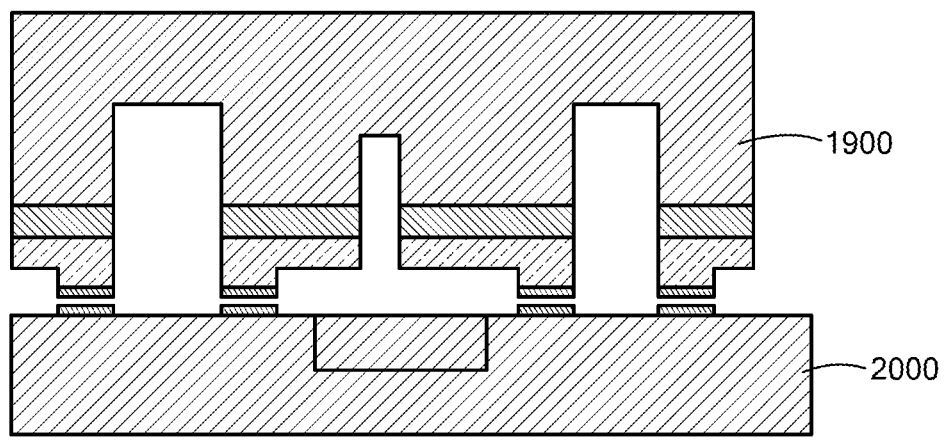
FIG. 21 shows the cap wafer bonded to the device wafer.

FIG. 21 shows the cap wafer 900 bonded to the device wafer 1000.

Figure 22:
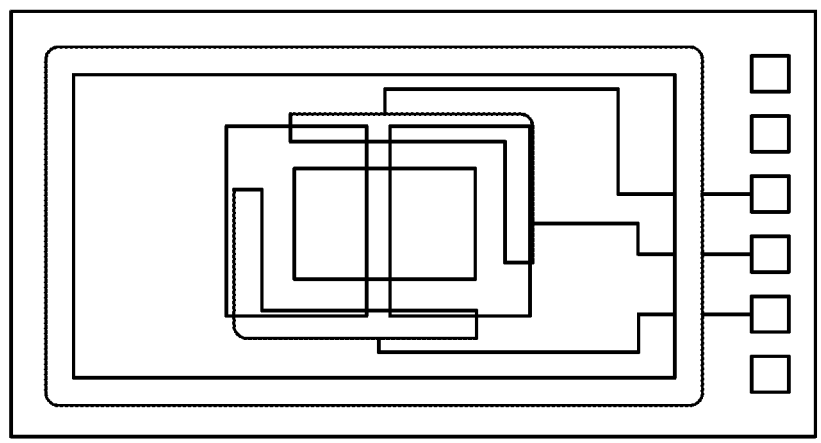
FIG. 22 shows a top "see-through" view of the device shown in FIG. 21.

FIG. 22 shows a top "see-through" view of the device shown in FIG. 21.

It should be noted that an electrically isolated electrode may be fabricated with multiple electrical contacts.

Thus, certain exemplary embodiments fabricate a plurality of electrical contacts on a top silicon (e.g., single-crystal silicon or polysilicon) layer of a wafer, etch exposed portions of the top silicon layer to recess such exposed portions relative to the electrical contacts, pattern the etched top silicon layer to define a plurality of electrically isolated electrodes with each electrically isolated electrode including at least one of the plurality of contacts, and etch the patterned top silicon layer to produce the plurality of electrically isolated electrodes.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A microelectromechanical systems (MEMS) device comprising:
   a cap wafer having a plurality of electrically isolated electrodes, at least one electrically isolated electrode of the plurality of electrically isolated electrodes including at least one electrical contact and a silicon electrode recessed from the at least one electrical contact; and
   a device wafer having a movable MEMS structure and at least one electrical contact, the device wafer being bonded to the cap wafer such that the at least one electrical contact of the device wafer is coupled to the at least one electrical contact of the cap wafer, and such that the silicon electrode at least partially overlies the movable MEMS structure.

2. A MEMS device according to claim 1, wherein the at least one electrical contact of the cap wafer comprises aluminum and wherein the at least one electrical contact of the device wafer comprises germanium.

3. A MEMS device according to claim 1, wherein the at least one electrical contact of the cap wafer comprises germanium and wherein the at least one electrical contact of the device wafer comprises aluminum.

4. A MEMS device according to claim 1, wherein the silicon electrode comprises a thicker part and a thinner part, wherein the thinner part is recessed from the thicker part and from the at least one electrical contact of the cap wafer.

5. A MEMS device according to claim 1, wherein the silicon electrode comprises polysilicon.

6. A MEMS device according to claim 1, wherein the cap wafer comprises at least one cavity between adjacent electrically isolated electrodes of the plurality of electrically isolated electrodes, and wherein the cavity extends through an oxide layer underlying the adjacent electrically isolated electrodes.

7. A MEMS device according to claim 6, wherein the at least one cavity extends through a silicon layer underlying the oxide layer.

8. A MEMS device according to claim 1, wherein the cap wafer comprises a silicon-on-insulator wafer.

9. A MEMS device according to claim 1, wherein the silicon electrode of the at least one electrically isolated electrode is configured to interact electrostatically with the movable MEMS structure of the device wafer.

10. A MEMS device according to claim 1, further comprising a recess formed between the cap wafer and the device wafer, wherein the movable MEMS structure is positioned adjacent to the recess.

11. A cap wafer for a microelectromechanical systems (MEMS) device, the cap wafer comprising:
    a plurality of electrically isolated electrodes, at least one electrically isolated electrode of the plurality of electrically isolated electrodes including at least one electrical contact and a silicon electrode recessed from the at least one electrical contact,
    wherein the cap wafer is configured to be bonded to a device wafer having a movable MEMS structure and at least one electrical contact such that the at least one electrical contact of the device wafer is coupled to the at least one electrical contact of the cap wafer, and such that the silicon electrode at least partially overlies the movable MEMS structure.

12. A cap wafer according to claim 11, wherein the at least one electrical contact comprises aluminum.

13. A cap wafer according to claim 11, wherein the at least one electrical contact comprises germanium.

14. A cap wafer according to claim 11, wherein the silicon electrode comprises a thicker part and a thinner part, wherein the thinner part is recessed from the thicker part and from the at least one electrical contact of the cap wafer.

15. A cap wafer according to claim 11, wherein the silicon electrode comprises polysilicon.

16. A cap wafer according to claim 11, wherein the cap wafer comprises at least one cavity between adjacent electrically isolated electrodes of the plurality of electrically isolated electrodes, and wherein the cavity extends through an oxide layer underlying the adjacent electrically isolated electrodes.

17. A cap wafer according to claim 16, wherein the at least one cavity extends through a silicon layer underlying the oxide layer.

18. A cap wafer according to claim 11, wherein the silicon electrode of the at least one electrically isolated electrode is configured to interact electrostatically with the movable MEMS structure of the device wafer.

19. A microelectromechanical systems (MEMS) device comprising:
    a cap wafer having a plurality of electrically isolated electrodes, at least one electrically isolated electrode of the plurality of electrically isolated electrodes including at least one electrical contact and a silicon electrode, wherein the silicon electrode comprises a thicker part and a thinner part, wherein the thinner part is recessed from the thicker part and from the at least one electrical contact of the cap wafer; and
    a device wafer having a movable MEMS structure and at least one electrical contact, the device wafer being bonded to the cap wafer such that the at least one electrical contact of the device wafer is coupled to the at least one electrical contact of the cap wafer.

20. A MEMS device according to claim 19, wherein the silicon electrode of the at least one electrically isolated electrode is configured to interact electrostatically with the movable MEMS structure of the device wafer.

* * * * *